United States Patent
Miles et al.

(10) Patent No.: US 7,616,369 B2
(45) Date of Patent: Nov. 10, 2009

(54) FILM STACK FOR MANUFACTURING MICRO-ELECTROMECHANICAL SYSTEMS (MEMS) DEVICES

(75) Inventors: Mark W Miles, San Francisco, CA (US); Brian J. Gally, Los Gatos, CA (US); Clarence Chui, San Mateo, CA (US)

(73) Assignee: IDC, LLC, Pleasanton, CA (US)

( * ) Notice: Subject to any disclaimer, the term of this patent is extended or adjusted under 35 U.S.C. 154(b) by 0 days.

(21) Appl. No.: 11/396,245

(22) Filed: Mar. 31, 2006

(65) Prior Publication Data

US 2006/0256420 A1    Nov. 16, 2006

Related U.S. Application Data

(63) Continuation of application No. 10/606,001, filed on Jun. 24, 2003, now Pat. No. 7,221,495.

(51) Int. Cl.
    *G02B 26/00*      (2006.01)
(52) U.S. Cl. ........................................ 359/290; 359/291
(58) Field of Classification Search ......... 359/290–298; 427/162–248.1; 430/319, 320, 321; 216/2
    See application file for complete search history.

(56) References Cited

U.S. PATENT DOCUMENTS

| | | | | |
|---|---|---|---|---|
| 2,534,846 | A | 12/1950 | Ambrose et al. | 348/270 |
| 3,439,973 | A | 4/1969 | Paul et al. | 382/204 |
| 3,443,854 | A | 5/1969 | Weiss | 359/486 |
| 3,616,312 | A | 10/1971 | McGriff et al. | 205/432 |
| 3,653,741 | A | 4/1972 | Marks | 359/352 |
| 3,656,836 | A | 4/1972 | de Cremoux et al. | 359/486 |
| 3,725,868 | A | 4/1973 | Malmer, Jr. et al. | 359/261 |
| 3,813,265 | A | 5/1974 | Marks | 712/245 |
| 3,955,880 | A | 5/1976 | Lierke | 427/473 |
| 4,099,854 | A | 7/1978 | Decker et al. | 359/291 |
| 4,196,396 | A | 4/1980 | Smith | 359/278 |
| 4,228,437 | A | 10/1980 | Shelton | 359/336 |
| 4,377,324 | A | 3/1983 | Durand et al. | 343/909 |
| 4,389,096 | A | 6/1983 | Hori et al. | 359/578 |
| 4,392,711 | A | 7/1983 | Moraw et al. | 359/292 |
| 4,403,248 | A | 9/1983 | te Velde | 349/5 |
| 4,441,791 | A | 4/1984 | Hornbeck | 359/295 |

(Continued)

FOREIGN PATENT DOCUMENTS

CH        681 047        12/1992

(Continued)

OTHER PUBLICATIONS

Akasaka, "Three-Dimensional IC Trends," Proceedings of IEEE, vol. 74, No. 12, pp. 1703-1714, (Dec. 1986).

(Continued)

*Primary Examiner*—Mohammed Hasan
(74) *Attorney, Agent, or Firm*—Knobbe, Martens, Olson & Bear LLP

(57) ABSTRACT

This invention provides a precursor film stack for use in the production of MEMS devices. The precursor film stack comprises a carrier substrate, a first layer formed on the carrier substrate, a second layer of an insulator material formed on the first layer, and a third layer of a sacrificial material formed on the second layer.

22 Claims, 4 Drawing Sheets

U.S. PATENT DOCUMENTS

| | | | | |
|---|---|---|---|---|
| 4,445,050 A | 4/1984 | Marks | ........................ | 307/145 |
| 4,459,182 A | 7/1984 | te Velde | ........................ | 205/122 |
| 4,482,213 A | 11/1984 | Piliavin et al. | ........................ | 349/153 |
| 4,500,171 A | 2/1985 | Penz et al. | ........................ | 349/190 |
| 4,519,676 A | 5/1985 | te Velde | ........................ | 359/223 |
| 4,531,126 A | 7/1985 | Sadones | ........................ | 342/173 |
| 4,566,935 A | 1/1986 | Hornbeck | ........................ | 438/29 |
| 4,571,603 A | 2/1986 | Hornbeck et al. | ........................ | 347/239 |
| 4,596,992 A | 6/1986 | Hornbeck | ........................ | 347/134 |
| 4,615,595 A | 10/1986 | Hornbeck | ........................ | 353/122 |
| 4,617,608 A | 10/1986 | Blonder et al. | ........................ | 361/291 |
| 4,662,746 A | 5/1987 | Hornbeck | ........................ | 359/223 |
| 4,663,083 A | 5/1987 | Marks | ........................ | 349/41 |
| 4,681,403 A | 7/1987 | te Velde et al. | ........................ | 359/291 |
| 4,710,732 A | 12/1987 | Hornbeck | ........................ | 310/328 |
| 4,748,366 A | 5/1988 | Taylor | ........................ | 385/8 |
| 4,786,128 A | 11/1988 | Birnbach | ........................ | 385/4 |
| 4,790,635 A | 12/1988 | Apsley | ........................ | 385/4 |
| 4,856,863 A | 8/1989 | Sampsell et al. | ........................ | 313/692 |
| 4,859,060 A | 8/1989 | Katagiri et al. | ........................ | 356/454 |
| 4,900,136 A | 2/1990 | Goldburt et al. | ........................ | 359/291 |
| 4,900,395 A | 2/1990 | Syverson et al. | ........................ | 438/706 |
| 4,937,496 A | 6/1990 | Neiger et al. | ........................ | 359/318 |
| 4,954,789 A | 9/1990 | Sampsell | ........................ | 359/317 |
| 4,956,619 A | 9/1990 | Hornbeck | ........................ | 345/84 |
| 4,965,562 A | 10/1990 | Verhulst | ........................ | 345/85 |
| 4,982,184 A | 1/1991 | Kirkwood | ........................ | 438/123 |
| 5,018,256 A | 5/1991 | Hornbeck | ........................ | 385/17 |
| 5,022,745 A | 6/1991 | Zayhowski et al. | ........................ | 359/291 |
| 5,028,939 A | 7/1991 | Hornbeck et al. | ........................ | 359/224 |
| 5,037,173 A | 8/1991 | Sampsell et al. | ........................ | 359/247 |
| 5,044,736 A | 9/1991 | Jaskie et al. | ........................ | 359/291 |
| 5,061,049 A | 10/1991 | Hornbeck | ........................ | 359/224 |
| 5,075,796 A | 12/1991 | Schildkraut et al. | ........................ | 359/247 |
| 5,078,479 A | 1/1992 | Vuilleumier | ........................ | 359/290 |
| 5,079,544 A | 1/1992 | DeMond et al. | ........................ | 345/84 |
| 5,083,857 A | 1/1992 | Hornbeck | ........................ | 359/230 |
| 5,096,279 A | 3/1992 | Hornbeck et al. | ........................ | 359/230 |
| 5,099,353 A | 3/1992 | Hornbeck | ........................ | 359/291 |
| 5,124,834 A | 6/1992 | Cusano et al. | ........................ | 359/291 |
| 5,136,669 A | 8/1992 | Gerdt | ........................ | 385/39 |
| 5,142,405 A | 8/1992 | Hornbeck | ........................ | 359/226 |
| 5,142,414 A | 8/1992 | Koehler | ........................ | 359/578 |
| 5,153,771 A | 10/1992 | Link et al. | ........................ | 359/286 |
| 5,162,787 A | 11/1992 | Thompson et al. | ........................ | 345/32 |
| 5,168,406 A | 12/1992 | Nelson | ........................ | 359/855 |
| 5,170,156 A | 12/1992 | DeMond et al. | ........................ | 345/85 |
| 5,172,262 A | 12/1992 | Hornbeck | ........................ | 359/224 |
| 5,179,274 A | 1/1993 | Sampsell | ........................ | 250/208.2 |
| 5,192,395 A | 3/1993 | Boysel et al. | ........................ | 216/13 |
| 5,192,946 A | 3/1993 | Thompson et al. | ........................ | 348/764 |
| 5,206,629 A | 4/1993 | DeMond et al. | ........................ | 345/206 |
| 5,212,582 A | 5/1993 | Nelson | ........................ | 359/224 |
| 5,214,419 A | 5/1993 | DeMond et al. | ........................ | 345/32 |
| 5,214,420 A | 5/1993 | Thompson et al. | ........................ | 345/6 |
| 5,216,537 A | 6/1993 | Hornbeck | ........................ | 438/23 |
| 5,226,099 A | 7/1993 | Mignardi et al. | ........................ | 369/223 |
| 5,228,013 A | 7/1993 | Bik | ........................ | 359/295 |
| 5,231,532 A | 7/1993 | Magel et al. | ........................ | 359/230 |
| 5,233,385 A | 8/1993 | Sampsell | ........................ | 359/230 |
| 5,233,456 A | 8/1993 | Nelson | ........................ | 345/84 |
| 5,233,459 A | 8/1993 | Bozler et al. | ........................ | 345/7 |
| 5,254,980 A | 10/1993 | Hendrix et al. | ........................ | 438/592 |
| 5,272,473 A | 12/1993 | Thompson et al. | ........................ | 345/108 |
| 5,278,652 A | 1/1994 | Urbanus et al. | ........................ | 345/697 |
| 5,280,277 A | 1/1994 | Hornbeck | ........................ | 359/9 |
| 5,287,096 A | 2/1994 | Thompson et al. | ........................ | 349/42 |
| 5,287,215 A | 2/1994 | Warde et al. | | |
| 5,293,272 A | 3/1994 | Jannson et al. | ........................ | 359/11 |
| 5,296,950 A | 3/1994 | Lin et al. | ........................ | 73/514.6 |
| 5,299,041 A | 3/1994 | Morin et al. | ........................ | 359/572 |
| 5,305,640 A | 4/1994 | Boysel et al. | ........................ | 216/24 |
| 5,311,360 A | 5/1994 | Bloom et al. | ........................ | 250/252.1 |
| 5,312,513 A | 5/1994 | Florence et al. | ........................ | 438/422 |
| 5,323,002 A | 6/1994 | Sampsell et al. | ........................ | 250/252.1 |
| 5,324,683 A | 6/1994 | Fitch et al. | ........................ | 438/422 |
| 5,325,116 A | 6/1994 | Sampsell | ........................ | 347/255 |
| 5,326,430 A | 7/1994 | Cronin et al. | ........................ | 438/524 |
| 5,327,286 A | 7/1994 | Sampsell et al. | ........................ | 359/561 |
| 5,330,617 A | 7/1994 | Haond | ........................ | 216/13 |
| 5,331,454 A | 7/1994 | Hornbeck | ........................ | 359/224 |
| 5,339,116 A | 8/1994 | Urbanus et al. | ........................ | 348/716 |
| 5,345,328 A | 9/1994 | Fritz et al. | ........................ | 359/248 |
| 5,347,377 A | 9/1994 | Revelli, Jr. et al. | ........................ | 349/193 |
| 5,355,357 A | 10/1994 | Yamamori et al. | ........................ | 720/646 |
| 5,358,601 A | 10/1994 | Cathey | ........................ | 438/721 |
| 5,365,283 A | 11/1994 | Doherty et al. | ........................ | 348/743 |
| 5,381,232 A | 1/1995 | van Wijk | ........................ | 356/519 |
| 5,381,253 A | 1/1995 | Sharp et al. | ........................ | 349/18 |
| 5,401,983 A | 3/1995 | Jokerst et al. | ........................ | 257/82 |
| 5,411,769 A | 5/1995 | Hornbeck | ........................ | 427/534 |
| 5,444,566 A | 8/1995 | Gale et al. | ........................ | 359/291 |
| 5,446,479 A | 8/1995 | Thompson et al. | ........................ | 345/6 |
| 5,448,314 A | 9/1995 | Heimbuch et al. | ........................ | 348/743 |
| 5,452,024 A | 9/1995 | Sampsell | ........................ | 348/755 |
| 5,454,906 A | 10/1995 | Baker et al. | ........................ | 216/66 |
| 5,457,493 A | 10/1995 | Leddy et al. | ........................ | 348/166 |
| 5,457,566 A | 10/1995 | Sampsell et al. | ........................ | 359/234 |
| 5,459,602 A | 10/1995 | Sampsell | ........................ | 359/234 |
| 5,459,610 A | 10/1995 | Bloom et al. | ........................ | 359/572 |
| 5,461,411 A | 10/1995 | Florence et al. | ........................ | 347/240 |
| 5,474,865 A | 12/1995 | Vasudev | ........................ | 430/5 |
| 5,485,304 A | 1/1996 | Kaeriyama | ........................ | 359/291 |
| 5,489,952 A | 2/1996 | Gove et al. | ........................ | 348/771 |
| 5,497,172 A | 3/1996 | Doherty et al. | ........................ | 348/771 |
| 5,497,197 A | 3/1996 | Gove et al. | ........................ | 340/323 R |
| 5,497,262 A | 3/1996 | Kaeriyama | | |
| 5,499,037 A | 3/1996 | Nakagawa et al. | ........................ | 345/89 |
| 5,499,062 A | 3/1996 | Urbanus | ........................ | 359/290 |
| 5,500,635 A | 3/1996 | Mott | ........................ | 345/85 |
| 5,500,761 A | 3/1996 | Goossen et al. | ........................ | 345/508 |
| 5,503,952 A | 4/1996 | Suzuki et al. | ........................ | 359/224 |
| 5,506,597 A | 4/1996 | Thompson et al. | ........................ | 359/224 |
| 5,515,076 A | 5/1996 | Thompson et al. | ........................ | 375/240.01 |
| 5,517,347 A | 5/1996 | Sampsell | ........................ | 375/240.01 |
| 5,523,803 A | 6/1996 | Urbanus et al. | ........................ | 359/224 |
| 5,526,051 A | 6/1996 | Gove et al. | ........................ | 359/224 |
| 5,526,172 A | 6/1996 | Kanack | ........................ | 359/291 |
| 5,526,327 A | 6/1996 | Cordova, Jr. | ........................ | 368/82 |
| 5,526,688 A | 6/1996 | Boysel et al. | ........................ | 73/514.35 |
| 5,526,951 A | 6/1996 | Bailey | ........................ | 216/24 |
| 5,535,047 A | 7/1996 | Hornbeck | ........................ | 359/295 |
| 5,548,301 A | 8/1996 | Kornher et al. | ........................ | 345/85 |
| 5,551,293 A | 9/1996 | Boysel et al. | ........................ | 73/514.14 |
| 5,552,924 A | 9/1996 | Tregilgas | ........................ | 359/224 |
| 5,552,925 A | 9/1996 | Worley | ........................ | 359/230 |
| 5,559,358 A | 9/1996 | Burns et al. | ........................ | 257/431 |
| 5,563,398 A | 10/1996 | Sampsell | ........................ | 235/454 |
| 5,567,334 A | 10/1996 | Baker et al. | ........................ | 216/24 |
| 5,570,135 A | 10/1996 | Gove et al. | ........................ | 348/581 |
| 5,579,149 A | 11/1996 | Moret et al. | ........................ | 359/223 |
| 5,581,272 A | 12/1996 | Conner et al. | ........................ | 345/85 |
| 5,583,688 A | 12/1996 | Hornbeck | ........................ | 359/291 |
| 5,589,852 A | 12/1996 | Thompson et al. | ........................ | 345/690 |
| 5,597,736 A | 1/1997 | Sampsell | ........................ | 438/22 |
| 5,600,383 A | 2/1997 | Hornbeck | ........................ | 348/771 |
| 5,602,671 A | 2/1997 | Hornbeck | ........................ | 359/224 |
| 5,606,441 A | 2/1997 | Florence et al. | ........................ | 349/33 |
| 5,608,468 A | 3/1997 | Gove et al. | ........................ | 348/771 |
| 5,610,438 A | 3/1997 | Wallace et al. | ........................ | 345/84 |
| 5,610,624 A | 3/1997 | Bhuva | ........................ | 345/85 |
| 5,610,625 A | 3/1997 | Sampsell | ........................ | 257/431 |
| 5,619,059 A | 4/1997 | Li et al. | ........................ | 359/248 |
| 5,619,365 A | 4/1997 | Rhoads et al. | ........................ | 359/248 |

| | | | |
|---|---|---|---|
| 5,619,366 A | 4/1997 | Rhoads et al. ............... 430/314 |
| 5,622,814 A | 4/1997 | Miyata et al. ............... 359/198 |
| 5,629,790 A | 5/1997 | Neukermans et al. ......... 345/97 |
| 5,631,782 A | 5/1997 | Smith et al. ............... 359/871 |
| 5,633,652 A | 5/1997 | Kanbe et al. ............... 368/84 |
| 5,636,052 A | 6/1997 | Arney et al. ............... 368/84 |
| 5,636,185 A | 6/1997 | Brewer et al. ............... 345/31 |
| 5,638,084 A | 6/1997 | Kalt ............... 200/181 |
| 5,638,946 A | 6/1997 | Zavracky ............... 200/181 |
| 5,641,391 A | 6/1997 | Hunter et al. ............... 205/80 |
| 5,646,768 A | 7/1997 | Kaciyama ............... 359/224 |
| 5,647,819 A | 7/1997 | Fujita et al. ............... 477/141 |
| 5,650,834 A | 7/1997 | Nakagawa et al. ......... 349/139 |
| 5,650,881 A | 7/1997 | Hornbeck ............... 205/122 |
| 5,654,741 A | 8/1997 | Sampsell et al. ............ 349/153 |
| 5,657,099 A | 8/1997 | Doherty et al. ............... 349/190 |
| 5,659,374 A | 8/1997 | Gale, Jr. et al. ............... 359/223 |
| 5,665,997 A | 9/1997 | Weaver et al. ............... 342/173 |
| 5,673,139 A | 9/1997 | Johnson ............... 439/29 |
| 5,674,757 A | 10/1997 | Kim ............... 347/239 |
| 5,683,591 A | 11/1997 | Offenberg ............... 347/134 |
| 5,703,710 A | 12/1997 | Brinkman et al. ............ 353/122 |
| 5,706,022 A | 1/1998 | Hato ............... 359/223 |
| 5,710,656 A | 1/1998 | Goossen ............... 349/41 |
| 5,726,480 A | 3/1998 | Pister ............... 359/291 |
| 5,739,945 A | 4/1998 | Tayebati ............... 359/291 |
| 5,745,193 A | 4/1998 | Urbanus et al. ............. 310/328 |
| 5,745,281 A | 4/1998 | Yi et al. ............... 385/8 |
| 5,751,469 A | 5/1998 | Arney et al. |
| 5,771,116 A | 6/1998 | Miller et al. ............... 385/4 |
| 5,783,864 A | 7/1998 | Dawson et al. ............... 257/758 |
| 5,784,190 A | 7/1998 | Worley ............... 385/4 |
| 5,784,212 A | 7/1998 | Hornbeck ............... 313/692 |
| 5,793,504 A | 8/1998 | Stoll ............... 359/318 |
| 5,808,780 A | 9/1998 | McDonald ............... 359/317 |
| 5,808,781 A | 9/1998 | Arney et al. |
| 5,818,095 A | 10/1998 | Sampsell ............... 345/84 |
| 5,822,110 A | 10/1998 | Dabbaj |
| 5,822,170 A | 10/1998 | Cabuz et al. ............... 345/92 |
| 5,824,608 A | 10/1998 | Gotoh et al. ............... 438/745 |
| 5,825,528 A | 10/1998 | Goossen ............... 438/23 |
| 5,835,255 A | 11/1998 | Miles ............... 359/847 |
| 5,838,484 A | 11/1998 | Goosen et al. ............... 359/282 |
| 5,842,088 A | 11/1998 | Thompson ............... 347/131 |
| 5,912,758 A | 6/1999 | Knipe et al. ............... 385/17 |
| 5,914,803 A | 6/1999 | Hwang et al. |
| 5,920,421 A | 7/1999 | Choi |
| 5,943,158 A | 8/1999 | Ford et al. ............... 359/291 |
| 5,959,763 A | 9/1999 | Bozler et al. ............... 359/224 |
| 5,967,163 A | 10/1999 | Pan et al. |
| 5,972,193 A | 10/1999 | Chou et al. ............... 359/290 |
| 5,976,902 A | 11/1999 | Shih ............... 345/84 |
| 5,986,796 A | 11/1999 | Miles ............... 359/230 |
| 5,998,293 A | 12/1999 | Dawson et al. ............... 438/619 |
| 6,016,693 A | 1/2000 | Viani et al. ............... 73/105 |
| 6,028,690 A | 2/2000 | Carter et al. ............... 359/230 |
| 6,031,653 A | 2/2000 | Wang |
| 6,038,056 A | 3/2000 | Florence et al. ............... 359/291 |
| 6,040,937 A | 3/2000 | Miles ............... 359/291 |
| 6,049,317 A | 4/2000 | Thompson et al. ............ 345/85 |
| 6,055,090 A | 4/2000 | Miles ............... 359/291 |
| 6,057,903 A | 5/2000 | Colgan et al. ............... 349/139 |
| 6,061,075 A | 5/2000 | Nelson et al. ............... 347/134 |
| 6,099,132 A | 8/2000 | Kaeriyama ............... 359/872 |
| 6,100,477 A | 8/2000 | Randall et al. |
| 6,100,872 A | 8/2000 | Aratani et al. ............... 345/589 |
| 6,113,239 A | 9/2000 | Sampsell et al. ............ 353/31 |
| 6,115,326 A | 9/2000 | Puma et al. ............... 367/118 |
| 6,147,790 A | 11/2000 | Meier et al. ............... 359/291 |
| 6,158,156 A | 12/2000 | Patrick ............... 40/443 |
| 6,160,833 A | 12/2000 | Floyd et al. ............... 372/96 |
| 6,165,890 A | 12/2000 | Kohl et al. |
| 6,166,422 A | 12/2000 | Qian et al. ............... 257/531 |
| 6,180,428 B1 | 1/2001 | Peeters et al. ............... 438/22 |
| 6,194,323 B1 | 2/2001 | Downey et al. ............ 438/717 |
| 6,195,196 B1 | 2/2001 | Kimura et al. ............... 359/295 |
| 6,201,633 B1 | 3/2001 | Peeters et al. ............... 359/296 |
| 6,204,080 B1 | 3/2001 | Hwang ............... 438/29 |
| 6,215,221 B1 | 4/2001 | Cabuz et al. |
| 6,232,936 B1 | 5/2001 | Gove et al. ............... 345/85 |
| 6,243,149 B1 | 6/2001 | Swanson et al. ............... 349/62 |
| 6,246,398 B1 | 6/2001 | Koo ............... 345/204 |
| 6,249,039 B1 | 6/2001 | Harvey et al. ............... 257/531 |
| 6,282,010 B1 | 8/2001 | Sulzbach et al. ............ 359/249 |
| 6,284,560 B1 | 9/2001 | Jech et al. ............... 438/48 |
| 6,288,472 B1 | 9/2001 | Cabuz et al. |
| 6,295,154 B1 | 9/2001 | Laor et al. ............... 359/223 |
| 6,297,072 B1 | 10/2001 | Tilmans et al. |
| 6,323,982 B1 | 11/2001 | Hornbeck ............... 345/108 |
| 6,327,071 B1 | 12/2001 | Kimura ............... 359/291 |
| 6,329,297 B1 | 12/2001 | Balish et al. ............... 438/714 |
| 6,335,831 B2 | 1/2002 | Kowarz et al. ............... 359/573 |
| 6,356,254 B1 | 3/2002 | Kimura ............... 345/108 |
| 6,358,021 B1 | 3/2002 | Cabuz |
| 6,359,673 B1 | 3/2002 | Stephenson |
| 6,376,787 B1 | 4/2002 | Martin et al. ............... 200/181 |
| 6,377,233 B2 | 4/2002 | Colgan et al. |
| 6,391,675 B1 | 5/2002 | Ehmke et al. ............... 438/53 |
| 6,392,233 B1 | 5/2002 | Channin et al. ............ 250/338.1 |
| 6,392,781 B1 | 5/2002 | Kim et al. ............... 385/18 |
| 6,407,851 B1 | 6/2002 | Islam et al. ............... 359/291 |
| 6,447,126 B1 | 9/2002 | Hornbeck ............... 359/871 |
| 6,448,622 B1 | 9/2002 | Franke et al. ............... 257/415 |
| 6,452,465 B1 | 9/2002 | Brown et al. ............... 333/205 |
| 6,456,420 B1 * | 9/2002 | Goodwin-Johansson .... 359/291 |
| 6,465,355 B1 | 10/2002 | Horsley ............... 359/247 |
| 6,466,354 B1 | 10/2002 | Gudeman ............... 359/292 |
| 6,466,358 B2 | 10/2002 | Tew ............... 359/292 |
| 6,473,274 B1 | 10/2002 | Maimone et al. ............ 360/294 |
| 6,480,177 B2 | 11/2002 | Doherty et al. ............ 340/825.6 |
| 6,496,122 B2 | 12/2002 | Sampsell ............... 340/825.6 |
| 6,513,911 B1 | 2/2003 | Ozaki et al. ............... 347/58 |
| 6,522,801 B1 | 2/2003 | Aksyuk et al. ............... 336/200 |
| 6,531,945 B1 | 3/2003 | Ahn et al. ............... 204/192.1 |
| 6,537,427 B1 | 3/2003 | Raina et al. ............... 385/22 |
| 6,545,335 B1 | 4/2003 | Chua et al. ............... 257/499 |
| 6,548,908 B2 | 4/2003 | Chua et al. ............... 257/773 |
| 6,549,338 B1 | 4/2003 | Wolverton et al. ......... 359/634 |
| 6,552,840 B2 | 4/2003 | Knipe ............... 359/291 |
| 6,574,033 B1 | 6/2003 | Chui et al. ............... 359/291 |
| 6,577,785 B1 | 6/2003 | Spahn et al. ............... 429/122 |
| 6,589,625 B1 | 7/2003 | Kothari et al. ............... 428/46 |
| 6,600,201 B2 | 7/2003 | Hartwell et al. ............. 257/415 |
| 6,602,791 B2 | 8/2003 | Ouellet et al. |
| 6,606,175 B1 | 8/2003 | Sampsell et al. ............ 398/140 |
| 6,608,268 B1 | 8/2003 | Goldsmith ............... 200/81 |
| 6,610,440 B1 | 8/2003 | LaFollette et al. ............. 345/84 |
| 6,618,187 B2 | 9/2003 | Pilossof |
| 6,625,047 B2 | 9/2003 | Coleman, Jr. ............... 365/51 |
| 6,630,786 B2 | 10/2003 | Cummings et al. .......... 313/553 |
| 6,632,698 B2 | 10/2003 | Ives ............... 438/52 |
| 6,635,919 B1 | 10/2003 | Melendez et al. ............ 257/512 |
| 6,642,913 B1 | 11/2003 | Kimura et al. ............. 200/334 |
| 6,643,069 B2 | 11/2003 | Dewald ............... 359/629 |
| 6,650,455 B2 | 11/2003 | Miles ............... 359/237 |
| 6,657,832 B2 | 12/2003 | Williams et al. ............... 361/15 |
| 6,666,561 B1 | 12/2003 | Blakley ............... 359/877 |
| 6,674,090 B1 | 1/2004 | Chua et al. |
| 6,674,562 B1 | 1/2004 | Miles ............... 359/291 |
| 6,674,563 B2 | 1/2004 | Chui et al. ............... 250/226 |
| 6,677,225 B1 | 1/2004 | Ellis et al. |
| 6,680,792 B2 | 1/2004 | Miles ............... 359/291 |
| 6,687,896 B1 | 3/2004 | Miles ............... 359/295 |
| 6,710,908 B2 | 3/2004 | Miles et al. ............... 359/291 |
| 6,713,235 B1 | 3/2004 | Ide et al. |
| 6,720,267 B1 | 4/2004 | Chen et al. ............... 438/694 |

| | | | | | |
|---|---|---|---|---|---|
| 6,736,987 B1 | 5/2004 | Cho ............................. 216/58 | 2002/0137072 A1 | 9/2002 | Mirkin et al. ................... 435/6 |
| 6,741,377 B2 | 5/2004 | Miles ........................ 359/243 | 2002/0146200 A1 | 10/2002 | Kudric et al. |
| 6,741,384 B2 | 5/2004 | Martin et al. ............ 365/189.05 | 2002/0149828 A1 | 10/2002 | Miles ........................ 438/107 |
| 6,741,503 B1 | 5/2004 | Farris et al. ................. 430/296 | 2002/0168136 A1 | 11/2002 | Atia et al. ...................... 385/18 |
| 6,743,570 B2 | 6/2004 | Harnett et al. ............... 359/291 | 2002/0186483 A1 | 12/2002 | Hagelin et al. |
| 6,747,785 B2 | 6/2004 | Chen et al. ................... 359/585 | 2003/0006468 A1 | 1/2003 | Ma et al. .................... 257/416 |
| 6,747,800 B1 | 6/2004 | Lin ............................ 438/745 | 2003/0016428 A1 | 1/2003 | Kato et al. |
| 6,756,317 B2 | 6/2004 | Sniegowski et al. ......... 365/149 | 2003/0043157 A1 | 3/2003 | Miles ........................ 359/291 |
| 6,768,097 B1 | 7/2004 | Viktorovitch et al. ....... 359/295 | 2003/0053078 A1 | 3/2003 | Missey et al. |
| 6,775,174 B2 | 8/2004 | Huffman et al. .............. 345/85 | 2003/0053233 A1 | 3/2003 | Felton |
| 6,778,155 B2 | 8/2004 | Doherty et al. .............. 359/224 | 2003/0054588 A1 | 3/2003 | Patel et al. .................. 438/107 |
| 6,778,306 B2 | 8/2004 | Sniegowski et al. ......... 430/313 | 2003/0062186 A1 | 4/2003 | Boroson et al. ............. 174/533 |
| 6,782,166 B1 | 8/2004 | Grote et al. | 2003/0072070 A1 | 4/2003 | Miles ........................ 359/291 |
| 6,788,175 B1 * | 9/2004 | Prophet ........................ 335/78 | 2003/0090350 A1 | 5/2003 | Feng et al. .................. 335/416 |
| 6,794,119 B2 | 9/2004 | Miles ........................ 359/291 | 2003/0112096 A1 | 6/2003 | Potter ........................ 333/186 |
| 6,806,110 B2 | 10/2004 | Lester et al. | 2003/0123126 A1 | 7/2003 | Meyer et al. |
| 6,811,267 B1 | 11/2004 | Allen et al. .................. 353/122 | 2003/0138213 A1 | 7/2003 | Jin et al. ..................... 324/663 |
| 6,812,482 B2 | 11/2004 | Fleming et al. ............... 257/17 | 2003/0152872 A1 | 8/2003 | Miles ........................ 359/291 |
| 6,819,469 B1 | 11/2004 | Koba ........................ 359/290 | 2003/0201784 A1 | 10/2003 | Potter ........................ 359/291 |
| 6,822,628 B2 | 11/2004 | Dunphy et al. ............. 345/75.2 | 2003/0202264 A1 | 10/2003 | Weber et al. ................ 359/877 |
| 6,829,132 B2 | 12/2004 | Martin et al. ............... 361/278 | 2003/0202265 A1 | 10/2003 | Reboa et al. ................ 359/877 |
| 6,853,129 B1 | 2/2005 | Cummings et al. .......... 313/495 | 2003/0202266 A1 | 10/2003 | Ring et al. .................. 359/877 |
| 6,855,610 B2 | 2/2005 | Tung et al. ................... 438/299 | 2003/0210851 A1 | 11/2003 | Fu et al. |
| 6,859,218 B1 | 2/2005 | Luman et al. ................ 347/139 | 2003/0231373 A1 | 12/2003 | Kowarz et al. .............. 359/291 |
| 6,861,277 B1 | 3/2005 | Monroe et al. ................ 438/48 | 2004/0010115 A1 | 1/2004 | Sotzing ...................... 528/377 |
| 6,862,022 B2 | 3/2005 | Slupe ........................ 345/207 | 2004/0027636 A1 | 2/2004 | Miles ........................ 359/243 |
| 6,862,029 B1 | 3/2005 | D'Souza et al. ............. 345/690 | 2004/0027671 A1 | 2/2004 | Wu et al. |
| 6,867,896 B2 | 3/2005 | Miles ........................ 359/291 | 2004/0027701 A1 | 2/2004 | Ishikawa .................... 359/883 |
| 6,870,581 B2 | 3/2005 | Li et al. ...................... 348/756 | 2004/0028849 A1 | 2/2004 | Stark et al. .................. 430/320 |
| 6,870,654 B2 | 3/2005 | Lin et al. .................... 359/245 | 2004/0035821 A1 * | 2/2004 | Doan et al. ................... 216/2 |
| 6,882,458 B2 | 4/2005 | Lin et al. .................... 359/245 | 2004/0051929 A1 | 3/2004 | Sampsell et al. ............ 359/247 |
| 6,882,461 B1 | 4/2005 | Tsai et al. .................... 359/290 | 2004/0053434 A1 | 3/2004 | Bruner ........................ 438/52 |
| 6,905,621 B2 | 6/2005 | Ho et al. ...................... 438/52 | 2004/0058532 A1 | 3/2004 | Miles et al. ................. 438/689 |
| 6,912,022 B2 | 6/2005 | Lin et al. .................... 359/245 | 2004/0061543 A1 | 4/2004 | Nam et al. ................... 327/342 |
| 6,952,303 B2 | 10/2005 | Lin et al. .................... 359/245 | 2004/0063322 A1 | 4/2004 | Yang ......................... 438/689 |
| 6,952,304 B2 | 10/2005 | Mushika et al. ............... 216/47 | 2004/0080807 A1 | 4/2004 | Chen et al. .................. 359/291 |
| 6,953,702 B2 | 10/2005 | Miller et al. | 2004/0087086 A1 | 5/2004 | Lee ........................... 438/257 |
| 6,958,847 B2 | 10/2005 | Lin ........................... 359/295 | 2004/0100677 A1 | 5/2004 | Huibers et al. .............. 528/377 |
| 6,987,432 B2 | 1/2006 | Lutz et al. | 2004/0100680 A1 | 5/2004 | Huibers et al. |
| 6,995,890 B2 | 2/2006 | Lin | 2004/0124073 A1 | 7/2004 | Pilans et al. ................. 200/181 |
| 6,999,236 B2 | 2/2006 | Lin | 2004/0124483 A1 | 7/2004 | Partridge et al. |
| 7,008,812 B1 | 3/2006 | Carley | 2004/0124495 A1 | 7/2004 | Chen et al. |
| 7,027,202 B1 | 4/2006 | Hunter et al. | 2004/0125281 A1 | 7/2004 | Lin et al. .................... 349/113 |
| 7,041,224 B2 | 5/2006 | Patel et al. | 2004/0125282 A1 | 7/2004 | Lin et al. .................... 349/113 |
| 7,049,164 B2 | 5/2006 | Bruner | 2004/0125347 A1 | 7/2004 | Patel et al. |
| 7,078,293 B2 | 7/2006 | Lin et al. | 2004/0125536 A1 | 7/2004 | Arney et al. ................ 361/302 |
| 7,110,158 B2 | 9/2006 | Miles | 2004/0136045 A1 | 7/2004 | Tran |
| 7,123,216 B1 | 10/2006 | Miles | 2004/0136076 A1 | 7/2004 | Tayebati ..................... 359/578 |
| 7,172,915 B2 | 2/2007 | Lin et al. | 2004/0145049 A1 | 7/2004 | McKinnell et al. .......... 257/719 |
| 7,198,973 B2 | 4/2007 | Lin et al. | 2004/0145811 A1 | 7/2004 | Lin et al. .................... 359/585 |
| 7,221,495 B2 * | 5/2007 | Miles et al. ................. 359/290 | 2004/0147056 A1 | 7/2004 | McKinnell et al. ............ 438/52 |
| 7,250,315 B2 | 7/2007 | Miles | 2004/0147198 A1 | 7/2004 | Lin et al. .................... 445/24 |
| 2001/0003487 A1 | 6/2001 | Miles ........................ 359/260 | 2004/0148009 A1 | 7/2004 | Buzzard .................... 623/1.12 |
| 2001/0026951 A1 | 10/2001 | Vergani et al. ................ 438/52 | 2004/0150869 A1 | 8/2004 | Kasai ........................ 359/290 |
| 2001/0040649 A1 | 11/2001 | Ozaki ........................ 349/43 | 2004/0160143 A1 | 8/2004 | Shreeve et al. .............. 310/309 |
| 2001/0040675 A1 | 11/2001 | True et al. ................... 355/77 | 2004/0174583 A1 | 9/2004 | Chen et al. .................. 359/290 |
| 2002/0014579 A1 | 2/2002 | Dunfield | 2004/0175577 A1 | 9/2004 | Lin et al. .................... 428/432 |
| 2002/0015215 A1 | 2/2002 | Miles ........................ 359/291 | 2004/0179281 A1 | 9/2004 | Reboa ........................ 359/872 |
| 2002/0021485 A1 | 2/2002 | Pilossof ...................... 359/291 | 2004/0191937 A1 | 9/2004 | Patel et al. ................... 438/21 |
| 2002/0024711 A1 | 2/2002 | Miles ........................ 359/291 | 2004/0191946 A1 | 9/2004 | Patel et al. |
| 2002/0027636 A1 | 3/2002 | Yamada | 2004/0207897 A1 | 10/2004 | Lin ........................... 359/254 |
| 2002/0036304 A1 | 3/2002 | Ehmke et al. ................ 257/254 | 2004/0207898 A1 | 10/2004 | Lin et al. |
| 2002/0054422 A1 | 5/2002 | Carr et al. | 2004/0209192 A1 | 10/2004 | Lin et al. .................... 430/311 |
| 2002/0054424 A1 | 5/2002 | Miles ........................ 359/291 | 2004/0209195 A1 | 10/2004 | Lin ........................... 430/315 |
| 2002/0055253 A1 | 5/2002 | Rudhard .................... 438/672 | 2004/0212026 A1 | 10/2004 | Van Brocklin et al. ....... 257/200 |
| 2002/0058422 A1 | 5/2002 | Jang et al. | 2004/0217378 A1 | 11/2004 | Martin et al. ............... 257/200 |
| 2002/0071169 A1 | 6/2002 | Bowers et al. ............... 359/291 | 2004/0217919 A1 | 11/2004 | Piehl et al. .................. 345/31 |
| 2002/0075555 A1 | 6/2002 | Miles ........................ 359/291 | 2004/0218251 A1 | 11/2004 | Piehl et al. .................. 361/139 |
| 2002/0086455 A1 | 7/2002 | Franosch et al. ............ 359/295 | 2004/0218334 A1 | 11/2004 | Martin et al. ............... 361/278 |
| 2002/0110948 A1 | 8/2002 | Huang et al. | 2004/0218341 A1 | 11/2004 | Martin et al. ............... 361/278 |
| 2002/0117728 A1 | 8/2002 | Brosnihan et al. | 2004/0227493 A1 | 11/2004 | Van Brocklin et al. ....... 320/166 |
| 2002/0126364 A1 | 9/2002 | Miles ........................ 359/291 | 2004/0240027 A1 | 12/2004 | Lin et al. .................... 359/260 |
| 2002/0135857 A1 | 9/2002 | Fitzpatrick et al. .......... 359/291 | 2004/0240032 A1 | 12/2004 | Miles ........................ 359/291 |

| | | | | | | |
|---|---|---|---|---|---|---|
| 2004/0240138 A1 | 12/2004 | Martin et al. ............... 361/139 | | JP | 2004106074 A | 4/2004 |
| 2004/0245588 A1 | 12/2004 | Nikkel et al. ................ 257/415 | | JP | 2004-212656 | 7/2004 |
| 2004/0263944 A1 | 12/2004 | Miles et al. ................. 359/291 | | JP | 2005051007 A | 2/2005 |
| 2005/0001828 A1 | 1/2005 | Martin et al. ............... 438/435 | | KR | 2002-9270 | 10/1999 |
| 2005/0003667 A1 | 1/2005 | Lin et al. .................... 438/690 | | KR | 2000-0033006 | 6/2000 |
| 2005/0020089 A1 | 1/2005 | Shi et al. ...................... 438/76 | | WO | WO 91/005284 | 4/1991 |
| 2005/0024557 A1 | 2/2005 | Lin ............................. 349/105 | | WO | WO 92/10925 | 6/1992 |
| 2005/0035699 A1 | 2/2005 | Tsai ............................ 313/110 | | WO | WO9530924 | 11/1995 |
| 2005/0036095 A1 | 2/2005 | Yeh et al. .................... 349/156 | | WO | WO9717628 | 5/1997 |
| 2005/0036192 A1 | 2/2005 | Lin et al. .................... 359/247 | | WO | WO9952006 A2 | 10/1999 |
| 2005/0038950 A1 | 2/2005 | Adelmann ................... 345/204 | | WO | WO9952006 A3 | 10/1999 |
| 2005/0042117 A1 | 2/2005 | Lin .......................... 417/413.3 | | WO | WO0114248 | 3/2001 |
| 2005/0046922 A1 | 3/2005 | Lin et al. .................... 359/291 | | WO | WO 01/063657 | 8/2001 |
| 2005/0046948 A1 | 3/2005 | Lin ............................. 359/585 | | WO | WO 02/24570 | 3/2002 |
| 2005/0057442 A1 | 3/2005 | Way .............................. 711/1 | | WO | WO 02/079853 | 10/2002 |
| 2005/0068583 A1 | 3/2005 | Gutkowski et al. .......... 370/401 | | WO | WO03007049 A1 | 1/2003 |
| 2005/0068605 A1 | 3/2005 | Tsai ............................ 359/290 | | WO | WO 03/014789 | 2/2003 |
| 2005/0068606 A1 | 3/2005 | Tsai ............................ 359/290 | | WO | WO 03/052506 | 6/2003 |
| 2005/0069209 A1 | 3/2005 | Damera-Venkata et al. 358/1.18 | | WO | WO 03/069413 A | 8/2003 |
| 2005/0078348 A1 | 4/2005 | Lin ............................. 359/290 | | WO | WO03069413 A1 | 8/2003 |
| 2005/0168849 A1 | 8/2005 | Lin ............................. 359/291 | | WO | WO03073151 A | 9/2003 |
| 2005/0195462 A1 | 9/2005 | Lin ............................. 359/850 | | WO | WO2004006003 A1 | 1/2004 |
| 2005/0195467 A1 | 9/2005 | Kothari et al. ............... 359/292 | | WO | WO2004026757 A2 | 4/2004 |
| 2005/0202649 A1 | 9/2005 | Hung et al. .................. 359/290 | | WO | WO 2005/019899 A1 | 3/2005 |
| 2006/0066932 A1 | 3/2006 | Chui ........................... 359/247 | | WO | WO 2005/085932 A | 9/2005 |
| 2006/0066935 A1 | 3/2006 | Cummings et al. | | | | |
| 2006/0257070 A1 | 11/2006 | Lin et al. | | | | |
| 2007/0269748 A1 | 11/2007 | Miles | | | | |
| 2008/0026328 A1 | 1/2008 | Miles | | | | |
| 2008/0068699 A1 | 3/2008 | Miles | | | | |

FOREIGN PATENT DOCUMENTS

| | | |
|---|---|---|
| CN | 092109265 | 11/2003 |
| DE | 199 38 072 | 3/2000 |
| DE | 10228946 A1 | 1/2004 |
| DE | 198 47 455 | 4/2004 |
| EP | 0 069 226 | 1/1983 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 | 2/1996 |
| EP | 0 788 005 | 8/1997 |
| EP | 0878824 A2 | 11/1998 |
| EP | 1197778 | 4/2002 |
| EP | 1 209 738 | 5/2002 |
| EP | 1258860 A1 | 11/2002 |
| EP | 1 275 997 | 1/2003 |
| EP | 1 452 481 A | 9/2004 |
| JP | 49-004993 | 1/1974 |
| JP | 405275401 A | 10/1993 |
| JP | 9-127439 | 5/1997 |
| JP | 10500224 | 1/1998 |
| JP | 10-107339 | 4/1998 |
| JP | 10-148644 | 6/1998 |
| JP | 10-267658 | 10/1998 |
| JP | 11-097799 | 4/1999 |
| JP | 11211999 A | 8/1999 |
| JP | 11243214 | 9/1999 |
| JP | 2000-40831 A | 2/2000 |
| JP | 2001-085519 | 3/2001 |
| JP | 2002-0287047 | 3/2001 |
| JP | 2002-062490 | 2/2002 |
| JP | 2002 062493 | 2/2002 |
| JP | 2002-207182 | 7/2002 |
| JP | 2002-243937 | 8/2002 |
| JP | 2002-270575 | 9/2002 |
| JP | 2002301698 | 10/2002 |
| JP | 2002-328313 | 11/2002 |
| JP | 2002-355800 | 12/2002 |
| JP | 2003001598 A | 1/2003 |
| JP | 2004-102022 A | 4/2004 |

OTHER PUBLICATIONS

Austrian Search Report dated May 4, 2005.
Austrian Search Report dated Aug. 12, 2005.
Aratani et al., "Surface micromachined tuneable interferometer array," Sensors and Actuators, pp. 17-23. (1994).
Conner, "Hybrid Color Display Using Optical Interference Filter Array," SID Digest, pp. 577-580 (1993).
EP 05255661.0 European Search Report (Dec. 30, 2005).
Fan et al., "Channel Drop Filters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics," John Wiley & Sons Inc., pp. 568-573.
Jerman et al., "A Miniature Fabry-Perot Interferometer with a Corrugated Silicon Diaphragm Support," (1988).
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).

Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060-Mar. (1996).
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies," Laser Focus World (May 1993).
Oliner et al., "Radiating Elements and Mutual Coupling," Microwave Scanning Antennas, vol 2, pp. 131-141, (1996).
PCT/US02/13442, Search Report Sep. 13, 2002.
PCT/US04/20330 Search Report Nov. 8, 2004.
PCT/US05/029821 International Search Report (Dec. 27, 2005).
PCT/US05/030927 International Search Report (Jan. 25, 2006).
PCT/US05/031693 International Search Report.
PCT/US05/032331 International Search Report (Apr. 7, 2006).
PCT/US05/033558 Partial International Search Report (Feb. 24, 2006).
PCT/US2004/035820 International Search Report and Written Opinion (Apr. 11, 2005).
PCT/US96/17731 Search Report.
Raley et al., "A Fabry-Perot Microinterferometer for Visible Wavelengths," IEEE Solid-State Sensor and Actuator Workshop, Jun. 1992, Hilton Head, SC.
Schnakenberg et al., "TMAHW Etchants for Silicon Micromachining," 1991 International Conference on Solid State Sensors and Actuators-Digest of Technical Papers, pp. 815-818 (1991).
Sperger et al., "High Performance Patterned All-Dielectric Interference Colour Filter for Display Applications," SID Digest, pp. 81-83, (1994).
Sridharan et al., "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.
Stone, "Radiation and Optics, An Introduction to the Classical Theory," McGraw-Hill, pp. 340-343, (1963).
Walker et al., "Electron-beam-tunable Interference Filter Spatial Light Modulator," Optics Letters vol. 13, No. 5, pp. 345-347, (May 1988).
Williams et al., "Etch Rates for Micromachining Processing," Journal of Microelectromechanical Systems, vol. 5, No. 4, pp. 256-259 (Dec. 1996).
Winters et al., "The etching of silicon with XeF2 vapor. Applied Physics Letters," vol. 34, No. 1, pp. 70-73 (Jan. 1979).
Winton, "A Novel way to capture solar energy," Chemical Week, (May 1985).
Wu, "Design of a Reflective Color LCD Using Optical Interference Reflectors," ASIA Display '95, pp. 929-931, (Oct. 1995).
Zhou et al., "Waveguide Panel Display Using Electromechanical Spatial Modulators" SID Digest, vol. XXIX, (1998).
RCO Pt Pub 157313, May 1, 1991, FSI International.
Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Austian Search Report for EX72/2005 dated May 13, 2005.
Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Crouse, "Self-ordered pore structure of anodized aluminum on silicon and pattern transfer" Applied Physics Letters, vol. 76, No. 1, Jan. 3, 2000. pp. 49-51.
French, P.J. "Development of Surface Micromachining techniques compatable with on-chip electronics" Journal of Micromechanics and Microengineering vol. 6 No. 2, 197-211 XP 002360789 Jun. 1996 IOP Publishing.
Furneaux, et al. "The Formation of Controlled-porosity membranes from Anodically Oxidized Aluminium" Nature vo 337 Jan. 12, 1989, pp. 147-149.
Jerman J. H. et al., "Maniature Fabry-Perot Interferometers Micromachined in Silicon for Use in Optical Fiber WDM Systems," Transducers. San Francisco, Jun. 24-27, 1991, Proceedings of the Internatioal Conference on Solid State Sensors Andactuators, New Youk IEEE, US, vol. Conf. 6, Jun. 24, 1991.
Miles, et al., "10.1: Digital Paper for Reflective Displays," 2002 SID International Symosium Digest of Technical Papers, Boston, MA, SID International Symposium Digest of Technical Papers, San Jose, CA, vol. 33 / 1, pp. 115-117 (May 21-23, 2002).
Penta Vacuum MEMS Etcher Specifications, http://www.pentavacuum.com/memes.htm.
Science and Technology, The Economist, pp. 89-90, (May 1999).
Search Report PCT/US05/031237 (Dec. 29, 2005).
Search Report PCT/US05/030033 and Written Opinion.
Search Report PCT/US05/030902.
Search Report and Written Opinion for PCT/US05/33558 (May 19, 2005).
Search Report PCT/US05/032331 (Apr. 7, 2006).
Search Report PCT/US05/032331 (Jan. 9, 2006).
Search Report and written opinion PCT/US05/032647.
Thin Film Transistors—Materials and Processes—vol. 1 Amorphous Silicon Thin Film Transistors ed. Yue Kuo, Kluwer Academic Publishers, Boston (2004).
Xactix Xetch X Specifications, http://xactix.com/Xtech X3specs.htm. Jan. 5, 2005.
Xactix Xetch Product information.
Office action from Chinese Application No. 200480020729.X including English translation.
Office Action dated Sep. 22, 2004, in U.S. Appl. No. 10/606,001.
Office Action dated Apr. 23, 2004 in U.S. Appl. No. 10/606,001.
IPRP for PCT/US04/20330 filed Jun. 23, 2004.
Yao et al., BrF3 dry release technology for large freestanding parylene microstructures and electrostatic actuators, Sensors and Actuators A, vol. 97-98, pp. 771-775, Apr. 2002.
Dai et al., "A CMOS surface micromachined pressure sensor," Journal of the Chinese institute of Engineers, 1999, vol. 22, No. 3 (May), pp. 375-380.
Wang et al., Flexible curcuit-based RF MEMS Switches, Proceedings of 2001 ASME International Mechanical Engineering Congress and Exposition, pp. 1-6, 2001.
Office Action received Apr. 11, 2008 in Chinese App. No. 200480020729.X.
Office Action issued by the Japanese Patent Office in related Application No. 2006-517633 dated Feb. 27, 2009 (including English Translation).

* cited by examiner

US 7,616,369 B2

FILM STACK FOR MANUFACTURING MICRO-ELECTROMECHANICAL SYSTEMS (MEMS) DEVICES

CROSS-REFERENCE TO RELATED APPLICATIONS

This application is a continuation of U.S. application Ser. No. 10/606,001 entitled "THIN FILM PRECURSOR STACK FOR MEMS MANUFACTURING", filed Jun. 24, 2003, now U.S. Pat. No. 7,221,495, which is hereby incorporated by reference in its entirety.

BACKGROUND OF THE INVENTION

1. Field of the Invention

This invention relates generally to fabrication processes for microelectromechanical systems (MEMS) devices and more specifically to the manufacture of interferometric modulators.

2. Description of the Related Art

An interferometric modulator is a class of MEMS (microelectromechanical systems) devices which have been described and documented in a variety of patents including U.S. Pat. Nos. 5,835,255, 5,986,796, 6,040,937, 6,055,090, and U.S. Pending patent application Ser. Nos. 09/966,843, 09/974,544, 10/082,397, 10/084,893, and 10/878,282, herein incorporated by reference. One of the key attributes of these devices is the fact that they are fabricated monolithically using semiconductor-like fabrication processes. Specifically, these devices are manufactured in a sequence of, steps which combine film deposition, photolithography, and etching using a variety of techniques. More detail on these processes is described in U.S. patent application Ser. No. 10/074,562 filed on Feb. 12, 2002, and herein incorporated by reference.

SUMMARY OF THE INVENTION

In one embodiment, a film stack for the production of MEMS devices is provided, the film stack including a substrate, a first layer formed over the substrate, a second layer formed over the first layer, said second layer including an insulator material, and a third layer formed on the second layer, the third layer including a sacrificial material, where each of the first, second and third layers are formed prior to post-deposition processing of the layers.

In another embodiment, a method of making a film stack for the production of MEMS devices is provided, the method including providing a substrate, forming a first layer over the substrate, forming a second layer over the first layer, the second layer including an insulator material, and forming a third layer over the second layer, the third layer including a sacrificial material, wherein forming each of the first, second and third layers is done prior to post-deposition processing of the layers.

In another embodiment, a film stack for the production of MEMS devices is provided, including means for conducting an electrical current, means for supporting the conducting means, means for insulating the conducting means, and means for defining the shape of an interferometric cavity above the conducting means.

DETAILED DESCRIPTION OF THE INVENTION

In the following detailed description of embodiments of the invention, numerous specific details are set forth such as examples of specific materials, machines, and methods in order to provide a thorough understanding of the present invention. It will be apparent, however, to one skilled in the art that these specific details need not be employed to practice the present invention. In other instances, well known materials, machines, or methods have not been described in detail in order to avoid unnecessarily obscuring the present invention.

A common characteristic of processes for manufacturing MEMS devices is that they begin with the deposition of a stack of thin films which are crucial to the operation and subsequent fabrication of the device. These precursor films are useful in the fabrication of a broad variety of MEMS devices including interferometric modulators, and their deposition can occur as a part of a larger process to manufacture the MEMS device. In one embodiment of the present invention the films are deposited separately in a stand alone facility to form a precursor stack, which is then sent to multiple facilities which complete the processing. The primary benefit is that the stand alone facility can be optimized to produce these films or precursor stacks at very high throughputs that allow for economies of scale not possible in an integrated factory, i.e., one that does both the deposition and post-deposition processing. Furthermore, since the technology development of the precursor stack occurs at the stand alone facility, entities which desire to perform the subsequent processing steps are faced with a lower technological barrier to entry.

Patent application Ser. No. 10/074,562 herein incorporated by reference describes a prototypical fabrication sequence for building interferometric modulators. In general, interferometric modulator fabrication sequences and categories of sequences are notable for their simplicity and cost effectiveness. This is due in large part to the fact that all of the films are deposited using physical vapor deposition (PVD) techniques with sputtering being the preferred and least expensive of the approaches. Part of the simplicity derives from the fact that all interferometric modulator structures, and indeed many other planar MEMS structures are bound by the fact that they require a lower electrode, an insulating structure to prevent shorting, a sacrificial material, and an actuatable or movable structure. An insulating structure differs from a film in that it is not continuous in its form but by mechanical means is able to prevent electrical contact through its body. This fact presents an opportunity in that a subset of these films, a precursor stack comprising one or more of the lower electrode, insulating structure, the sacrificial layer, and optionally an actuatable structure may be manufactured separately and in advance of the actuatable structure or structures.

Figure 1:
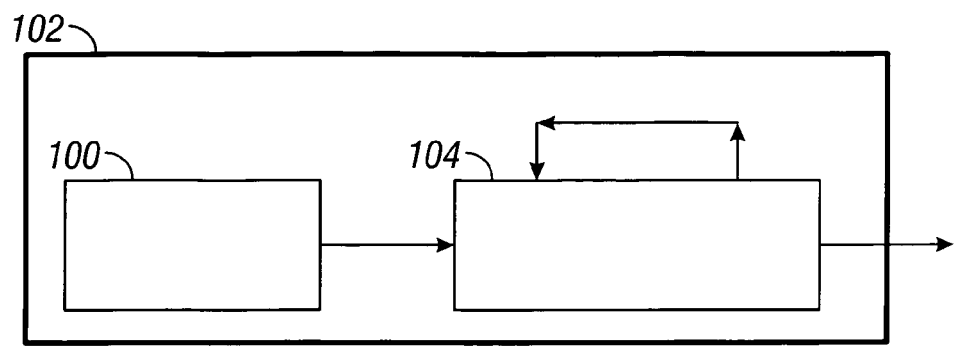
FIG. 1 shows a block diagram of an integrated MEMS processing facility.

FIG. 1 of the drawings provides a block diagram of an integrated MEMS fabrication facility 102. A precursor film deposition tool 100, comprises a single or series of deposition tools which are configured to deposit these films using one or more deposition techniques, e.g., sputtering. The films are deposited on a suitable carrier substrate, which could be glass or plastic, for example, depending on the application, and subsequently transported to micro-machining loop 104. Here, and as described in the aforementioned patent applications, a sequence of repeated steps, such as etching, patterning, and deposition, are performed and serve to define the actuatable structure of the MEMS device.

Figure 2:
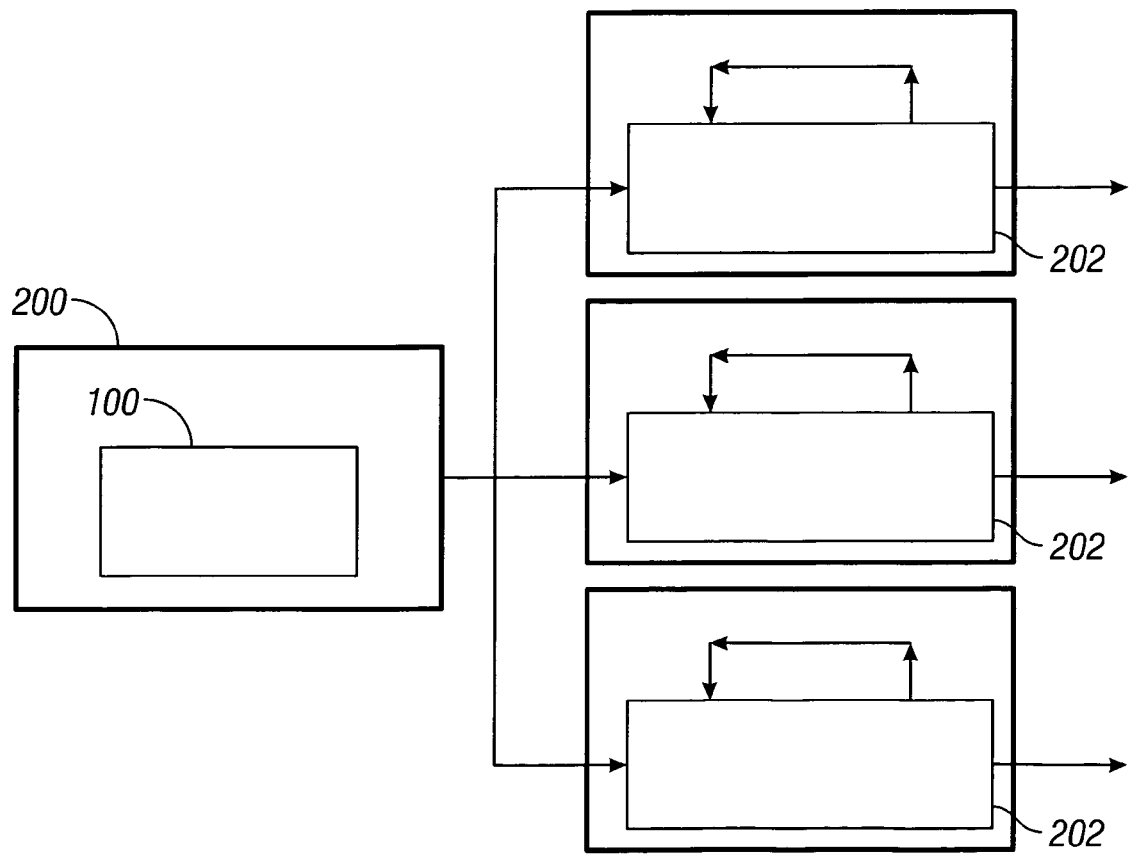
FIG. 2 shows a block diagram of a non-integrated MEMS processing facility.

FIG. 2 of the drawings shows a non-integrated MEMS processing facility. Referring to FIG. 2, a pre-cursor facility 200 contains only a precursor film deposition tool 100 which is equivalent to that described in FIG. 1, hence the use of the same reference numeral. The facility 200 is capable of providing variations on both precursor film type and substrate size. After the deposition, the substrates are containerized and shipped as appropriate to one or more processing facilities indicated by reference numeral 202. These facilities then perform the machining steps as required for the particular MEMS product that they are designed to produce.

Figure 3:
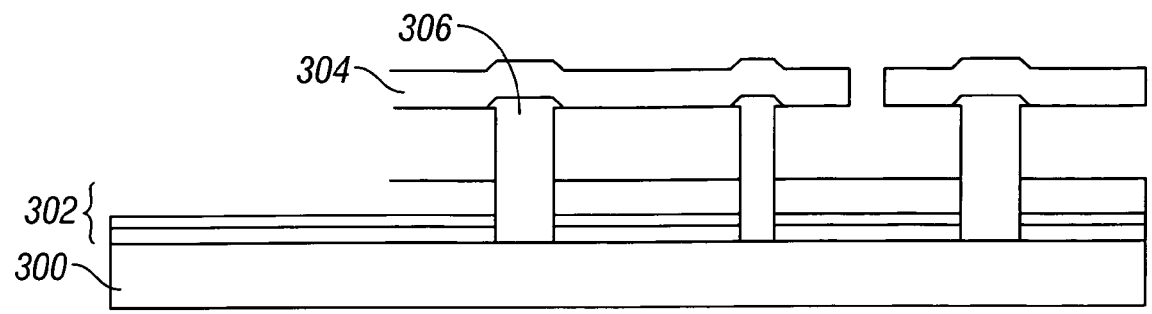
FIG. 3 shows a block diagram of a MEMS device which can be fabricated using a precursor stack of the present invention.

FIG. 3 shows a schematic drawing of a simple MEMS device which can be fabricated using a precursor stack of the present invention. In this case an actuatable membrane 304, is supported on posts 306. Films 302 comprise materials which at a minimum provide a lower electrode and an insulating structure, though other functions, as will be discussed, may be incorporated. The entire assembly resides on a substrate 300.

FIGS. 4A to 4F of the drawings show block diagrams of precursor stacks in accordance with different embodiments of the invention. In FIGS. 4A to 4F, the same reference numerals have been used to identify the same or similar features/components.

Figure 4A:
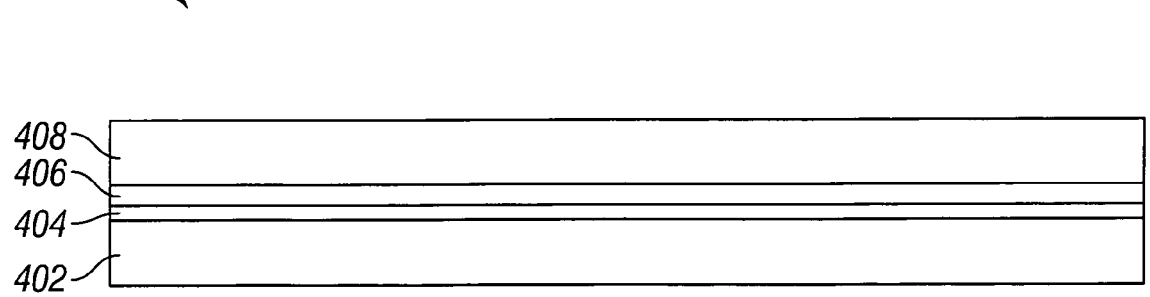
FIGS. 4A to 4F show block diagrams of precursor stacks of the present invention, according to different embodiments.

FIG. 4A shows a block diagram of a generalized precursor stack 400A that includes conductor stack or structure 404, an insulator layer 406, and a sacrificial material layer 408. All the films reside on a substrate 402. The conductor stack 404 may comprise a single metal, a conductive oxide or polymer, a fluoride, a silicide or combinations of these materials. The exact composition of the conductive stack is determined by the requisite electrode properties of the MEMS device to be manufactured. The insulator 408, can be any one or a combination of a variety of insulating materials which include but are not limited to oxides, polymers, fluorides, ceramics, and nitrides. The sacrificial material 408, may include, for example, a single layer of materials such as silicon, molybdenum, or tungsten which are all etchable by XeF2, which is a process etch gas that has been described in prior patents. Other materials are possible subject to the compatibility of the etching medium to the materials and structures which must remain. Thicknesses vary according to the requisite behavior of the final device.

Figure 4B:
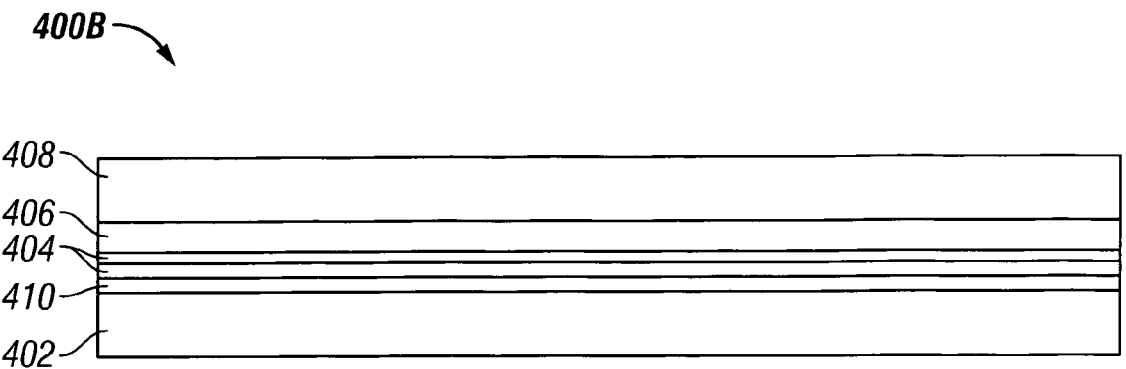

FIG. 4B shows a block diagram of a precursor stack 400B designed for use in the fabrication of an interferometric modulator device. The stack 400B includes a conductor stack 404, the composition of which has been described above. Suitable metals for the conductor stack 404 in the present case include glossy metals such as Chromium, Tungsten, Molybdenum, or alloys thereof. The conductor stack 404 may have a thickness of up to 150 angstroms. Transparent conductors suitable for use in the conductor stack 404 include indium tin oxide (ITO), zinc oxide (ZnO), and titanium nitride (TiN). Typical thicknesses for the transparent conductors range from 100 to 800 angstroms. The conductor stack 404 resides on a transparent compensating oxide layer 410, in one embodiment. The oxide layer 410 may be of a metallic oxide, such as zirconia (ZrO2) or hafnia (HfO2), which have a finite extinction coefficient within the visible range. The compensating oxide layer 410 is an optional film for all the designs discussed in this patent application. Typical thicknesses for the oxide layer 410 range from 100 to 800 angstroms. It should be noted that the positions of the conductor stack 404 and the compensating oxide layer 410 are interchangeable with only subtle changes in the optical behavior. his design, however, can be considered an embedded optical film design since the metal, which plays the primary optical function, resides on the side of insulator layer 406, opposite that of the sacrificial layer 408. The insulator layer 406, may comprise a silicon dioxide film with a thickness ranging from 280 to 840 angstroms for good black states, although other thicknesses are useful for different interference modulator operational modes. Other oxides or combinations of oxides are possible as well. The sacrificial layer 408 may include a single layer of materials such as silicon, molybdenum, tungsten, for example, which are all etchable by XeF2, a process etch gas which has been described in prior patents. For the stack 400B, the thickness of the layer 408 may vary from 1000, to 7000 angstroms.

Figure 4C:
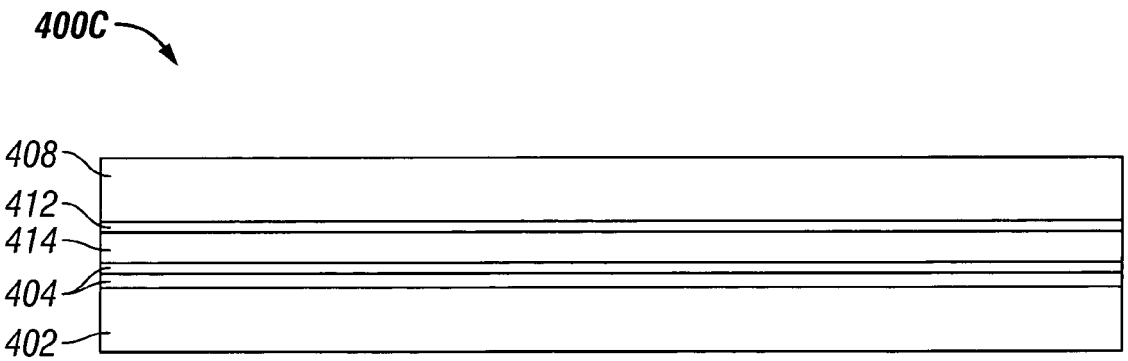

FIG. 4C shows a block diagram of a precursor stack 400C, in accordance with another embodiment. In this case, the conductor stack 404 does not perform any optical functions. Instead, a separate optical film 412 performs the optical function. The optical film 412 is separated from the conductor stack 404 by an insulator film or structure 414. This design allows for high quality white states to be achieved when the actuatable membrane is driven. In this case the optical film 412 does not serve as a conductor. It is the transparent conductor stack 404 which functions as a conductor. An ancillary insulator film or structure which is not shown in FIG. 4C but which is similar to the insulator layer 406 of FIG. 4B, may reside between the sacrificial layer 408 and the optical film 412, in some embodiments. The thickness of the insulator film or structure may be less than 100 angstroms for this design.

Figure 4D:
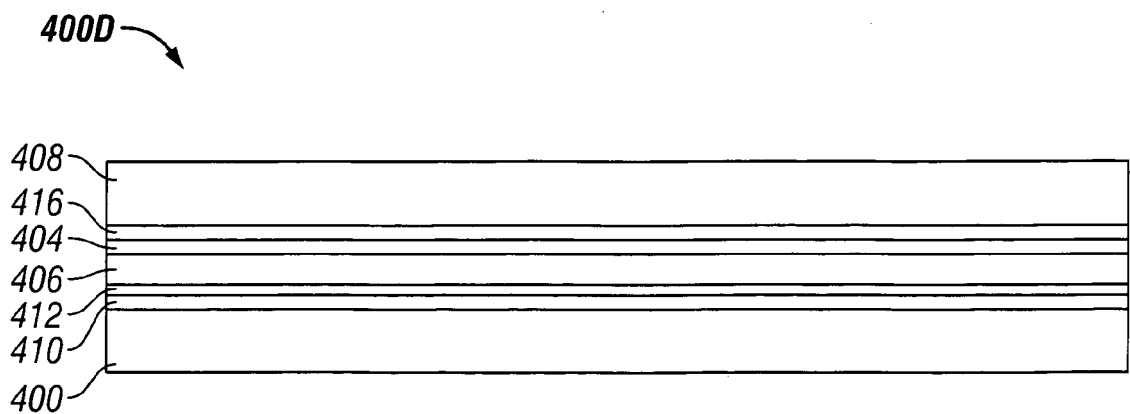

FIG. 4D shows an embodiment 400D of a precursor stack, known as a buried optical film design. In this case, an optical film 412, resides over an optical compensation film 410, which resides below an insulator film/structure 406. A transparent conductor film or film stack 404, follows and is capped by an additional oxide layer 416, and a sacrificial film layer 408. One advantage of the stack 400D is that it allows for the effective optical distance between the optical film 412 and the mechanical film to be large while allowing the driving voltages to remain small. This is because the driving voltages are significantly determined by the distance between the conductor and the actuatable membrane.

Figure 4E:
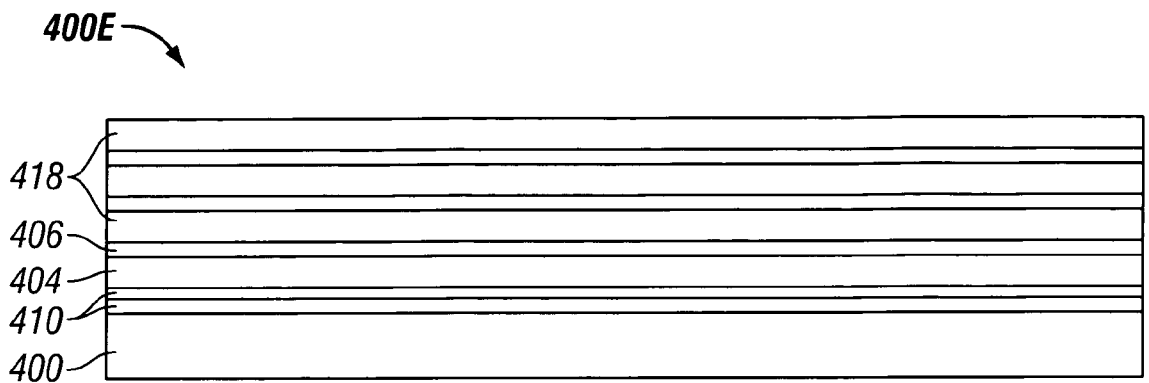

FIG. 4E shows a precursor stack 400E which includes a multi-layer etch stop stack 418 incorporated instead of a single layer sacrificial film. This stack 418 provides a convenient means for predefining heights for multiple actuable structures to be defined during subsequent micro-machining processes. In one embodiment, the stack 418 comprises at least two materials which can be etched using the same release etch, but can utilize alternative and different etch chemistries so that one material may act as an etch stop for the other. One example would be a combination of molybdenum and silicon that are both etchable in XeF2. However, a phosphoric based wet etchant may be used to etch molybdenum without attacking silicon, and a tetra-methyl-ammonium hydroxide (TMMA) may be used to etch silicon without etching molybdenum. Many other combinations exist and can be identified and exploited by those skilled in the art. Further, it should be noted that the etch stop stack may be applied to any of the previously defined precursor stacks in place of the single sacrificial layer.

Figure 4F:
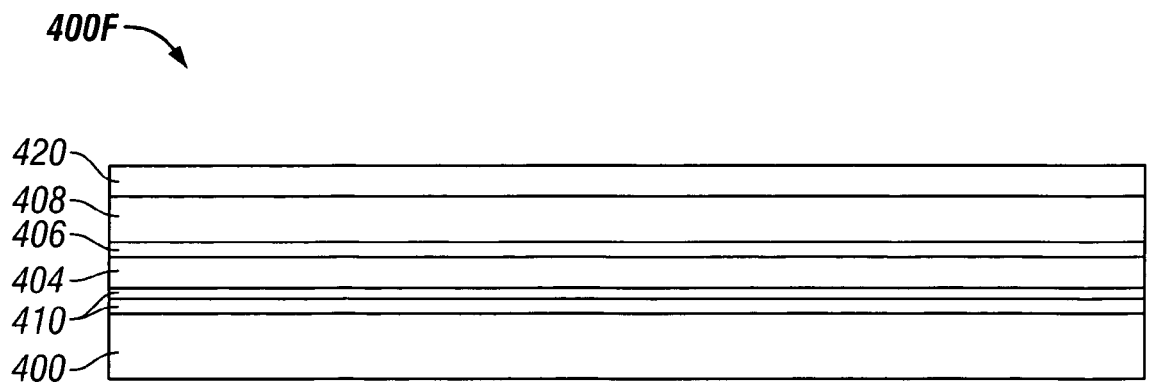

FIG. 4F of the drawings shows an embodiment 400F of a precursor stack. The precursor stack 400F includes a mechanical structural material 420. Using proper micro-machining techniques and sequences, a functioning MEMS device may be fabricated using the precursor stack 400F using only patterning and etching. Thus, during post-processing of the precursor stack 400F no deposition is required. This means that a post-processing facility such as the facility 202 (see FIG. 2) does not require capital investment in deposition tools. The material 420 may comprise any number of materials, including but not limited to metals, polymers, oxides, and combinations thereof, whose stress can be controlled.

What is claimed is:

1. A film stack for the production of MEMS devices, the film stack comprising:
   a substrate;
   a first layer formed over the substrate, said first layer comprising a conductive material;;
   a second layer formed over the first layer, said second layer comprising an insulator material; and
   a third layer formed on the second layer, said third layer comprising a sacrificial material, wherein said third layer is formed prior to processing of said first and second layers which takes place after the deposition of said first and second layers.

2. The stack of claim 1, wherein the first, the second and the third layers are formed using a deposition technique.

3. The stack of claim 1, wherein the first layer comprises at least one of the following: a single metal, a conductive oxide, a fluoride, a suicide, and a conductive polymer.

4. The stack of claim 3, further comprising an optical compensation layer formed over the substrate, the optical compensation layer comprising a material of a finite extinction coefficient.

5. The stack of claim 4, wherein the optical compensation layer is formed over the first layer.

6. The stack of claim 4, wherein the optical compensation layer is formed under the first layer.

7. The stack of claim 4, wherein the optical compensation layer comprises a material comprising at least one of the following: Zirconia and Hafnia.

8. The stack of claim 4, wherein the optical compensation layer comprises a material comprising at least one of the following: an oxide, a nitride, and a fluoride.

9. The stack of claim 1, wherein the first layer comprises at least one of the following: Chromium, Tungsten, and Molybdenum.

10. The stack of claim 1, wherein the first layer comprises at least one of the following: indium tin oxide (ITO), zinc oxide (ZnO), and titanium nitride (TiN).

11. The stack of claim 1, wherein the insulator material comprises at least one of the following: an oxide, a polymer, a fluoride, a ceramic and a nitride.

12. The stack of claim 11, wherein the sacrificial material is etchable using a Xenon difluoride gas.

13. The stack of claim 1, wherein the sacrificial material is selected from the group consisting of silicon, molybdenum, and tungsten.

14. The stack of claim 1, wherein the first layer comprises a plurality of sublayers, at least one of the sublayers comprising a conductive material.

15. The stack of claim 14, wherein the sublayer furthest from the carrier substrate defines an optical layer.

16. The stack of claim 15, wherein the optical layer comprises a substantially non-conductive material.

17. The stack of claim 15, wherein the optical layer comprises a substantially conductive material.

18. The stack of claim 1, wherein at least one of the second layer and the third layer comprises a plurality of sublayers.

19. The stack of claim 1, further comprising an optical layer deposited between the second and third layers.

20. The stack of claim 19, wherein the optical layer comprises a substantially non-conductive material.

21. The stack of claim 1, wherein the third layer comprises at least two sublayers, each sublayer alternating with the other, wherein each sublayer can be etched by the same release etchant, but has a different etch chemistry so that the sublayers define etch stops for each other.

22. The stack of claim 21, wherein the third layer comprises a sublayer of molybdenum that alternates with a sublayer of silicon.

* * * * *

UNITED STATES PATENT AND TRADEMARK OFFICE
CERTIFICATE OF CORRECTION

| | | |
|---|---|---|
| PATENT NO. | : 7,616,369 B2 | |
| APPLICATION NO. | : 11/396245 | |
| DATED | : November 10, 2009 | |
| INVENTOR(S) | : Mark W. Miles, Brian J. Gally and Clarence Chui | |

It is certified that error appears in the above-identified patent and that said Letters Patent is hereby corrected as shown below:

Title Page, Item 75, Line 1, change "Mark W Miles," to --Mark W. Miles,--.

At Page 3, Column 1, Line 11, under U.S. Patent Documents, change "Kaciyama" to --Kaeriyama--.

At Page 3, Column 1, Line 43, under U.S. Patent Documents, change "Goosen et al." to --Goossen et al.--.

At Page 5, Column 2, Line 38, under Other Publications, change "Quanum" to --Quantum--.

At Page 5, Column 2, Line 48, under Other Publications, change "IEE," to --IEEE,--.

At Page 6, Column 1, Line 27, under Other Publications, change "(1996)." to --(1966).--.

At Page 6, Column 2, Line 3, under Other Publications, change "Austian" to --Austrian--.

At Page 6, Column 2, Line 13, under Other Publications, change "Aluminoa" to --Alumina--.

At Page 6, Column 2, Line 14, under Other Publications, change "onglass" to --on glass--.

At Page 6, Column 2, Line 20, under Other Publications, change "compatable" to --compatible--.

At Page 6, Column 2, Line 24, under Other Publications, change "vo" to --vol.--.

At Page 6, Column 2, Line 26, under Other Publications, change "Maniature" to --Miniature--.

Signed and Sealed this
Thirteenth Day of March, 2012

David J. Kappos
*Director of the United States Patent and Trademark Office*

CERTIFICATE OF CORRECTION (continued)
U.S. Pat. No. 7,616,369 B2

At Page 6, Column 2, Line 29, under Other Publications, change "Internatioal" to --International--.

At Page 6, Column 2, Line 29, under Other Publications, change "Andactuators," to --and Actuators,--.

At Page 6, Column 2, Line 30, under Other Publications, change "Youk" to --York--.

At Page 6, Column 2, Line 32, under Other Publications, change "Symosium" to --Symposium--.

At Page 6, Column 2, Line 63, under Other Publications, change "curcuit" to --circuit--.

At Page 3, Line 42, change "XeF2," to --$XeF_2$,--.

At Page 3, Line 62, change "(ZrO2) to --($ZrO_2$)--.

At Column 3, Line 62, change "(HfO2)," to --($HfO_2$),--.

At Column 4, Line 2, change "his" to --This--.

At Column 4, Line 13, change "XeF2," to --$XeF_2$,--.

At Column 4, Line 48, change "actuable" to --actuatable--.

At Column 4, Line 55, change "XeF2." to --$XeF_2$.--.

At Column 5, Line 14, in Claim 1, change "material;;" to --material;--.

At Column 5, Line 26, in Claim 3, change "suicide," to --silicide,--.

At Column 6, Line 18, in Claim 15, change "furthest" to --farthest--.